US008362391B2

(12) United States Patent
Partlo et al.

(10) Patent No.: US 8,362,391 B2
(45) Date of Patent: *Jan. 29, 2013

(54) LASER THIN FILM POLY-SILICON ANNEALING OPTICAL SYSTEM

(75) Inventors: William N. Partlo, Poway, CA (US); Palash P. Das, Vista, CA (US); Russell Hudyma, San Ramon, CA (US); Michael Thomas, Belmont, MA (US)

(73) Assignee: TCZ, LLC, San Diego, CA (US)

( * ) Notice: Subject to any disclaimer, the term of this patent is extended or adjusted under 35 U.S.C. 154(b) by 9 days.

This patent is subject to a terminal disclaimer.

(21) Appl. No.: 12/979,292

(22) Filed: Dec. 27, 2010

(65) Prior Publication Data

US 2011/0163077 A1 Jul. 7, 2011

Related U.S. Application Data

(60) Division of application No. 11/201,877, filed on Aug. 11, 2005, now Pat. No. 7,884,303, which is a continuation of application No. 10/884,101, filed on Jul. 1, 2004, now Pat. No. 7,009,140, which is a continuation-in-part of application No. 10/781,251, filed on Feb. 18, 2004, now Pat. No. 7,167,499, which is a continuation-in-part of application No. 10/722,992, filed on Nov. 26, 2003, now abandoned, which is a continuation-in-part of application No. 10/631,349, filed on Jul. 30, 2003, now Pat. No. 7,039,086, which is a continuation-in-part of application No. 10/233,253, filed on Aug. 30, 2002, now Pat. No. 6,704,339, which is a continuation-in-part of application No. 10/012,002, filed on Nov. 30, 2001, now Pat. No. 6,625,191, which is a continuation-in-part of application No. 09/943,343, filed on Aug. 29, 2001, now Pat. No. 6,567,450, which is a continuation-in-part of application No. 09/837,035, filed on Apr. 18, 2001, now Pat. No. 6,618,421.

(51) Int. Cl.
*B23K 26/00* (2006.01)

(52) U.S. Cl. ............ 219/121.65; 219/121.66; 219/121.6

(58) Field of Classification Search ............ 219/121.65, 219/121.66, 121.6, 121.73, 121.85
See application file for complete search history.

(56) References Cited

U.S. PATENT DOCUMENTS

| 6,573,161 B1 * | 6/2003 | Miyasaka et al. ............ 438/487 |
| 6,861,614 B1 * | 3/2005 | Tanabe et al. ............ 219/121.66 |
| 7,009,140 B2 * | 3/2006 | Partlo et al. ............ 219/121.65 |

* cited by examiner

*Primary Examiner* — M. Alexandra Elve
(74) *Attorney, Agent, or Firm* — Procopio, Cory, Hargreaves & Savitch LLP; Noel C. Gillespie

(57) ABSTRACT

A high energy, high repetition rate workpiece surface heating apparatus is disclosed which comprise a XeF laser producing a laser output light pulse beam, an optical system narrowing the laser output light pulse beam in the short axis of the laser output light pulse beam and expanding the laser output light pulse beam to form in a long axis of the beam a workpiece covering extent of the long axis, the optical system focuses the laser output light pulse beam at a field stop with a magnification sufficient to maintain an intensity profile that has sufficiently steep sidewalls to allow the field stop to maintain a sufficiently steep beam profile at the workpiece.

20 Claims, 13 Drawing Sheets

LASER THIN FILM POLY-SILICON ANNEALING OPTICAL SYSTEM

CROSS-REFERENCE TO RELATED APPLICATIONS

This application is a division of U.S. application Ser. No. 11/201,877, entitled LASER THIN FILM POLY-SILICON ANNEALING OPTICAL SYSTEM, filed on Aug. 11, 2005, which is a continuation of U.S. application Ser. No. 10/884,101, now U.S. Pat. No. 7,009,140, entitled LASER THIN FILM POLY-SILICON ANNEALING OPTICAL SYSTEM, filed on Jul. 1, 2004, which is a continuation-in-part of U.S. application Ser. No. 10/781,251, now U.S. Pat. No. 7,167,499, entitled VERY HIGH ENERGY, HIGH STABILITY GAS DISCHARGE LASER SURFACE TREATMENT SYSTEM, filed on Feb. 18, 2004, which was a continuation-in-part of U.S. application Ser. No. 10/722,992, entitled VERY HIGH ENERGY, HIGH STABILITY GAS DISCHARGE LASER SURFACE TREATMENT SYSTEM, filed on Nov. 26, 2003, which was a continuation in part of U.S. application Ser. No. 10/631,349, now U.S. Pat. No. 7,039,086, entitled CONTROL SYSTEM FOR TWO CHAMBER GAS DISCHARGE LASER, filed Jul. 30, 2003; and which was a continuation-in-part of U.S. application Ser. No. 10/233,253, now U.S. Pat. No. 6,704,339, entitled LITHOGRAPHY LASER WITH BEAM DELIVERY AND BEAM POINTING CONTROL, filed on Aug. 30, 2002; which was a continuation-in-part of U.S. application Ser. No. 10/012,002, now U.S. Pat. No. 6,625,191, filed on Nov. 30, 2001, entitled VERY NARROW BAND, TWO CHAMBER, HIGH REP RATE GAS DISCHARGE LASER SYSTEM, issued on Sep. 23, 2003, and which was a continuation-in-part of U.S. application Ser. No. 09/943,343, now U.S. Pat. No. 6,567,450, filed on Aug. 29, 2001, entitled VERY NARROW BAND, TWO CHAMBER, HIGH REP RATE GAS DISCHARGE LASER SYSTEM, and which was a continuation in part of U.S. application Ser. No. 09/837,035, now U.S. Pat. No. 6,618,421, filed on Jul. 30, 2001, entitled HIGH REPETITION RATE GAS DISCHARGE LASER WITH PRECISE PULSE TIMING CONTROL, the disclosures of all of which are hereby incorporated by reference.

The parent application Ser. No. 11/201,877 is related to U.S. application Ser. No. 10/607,407, now U.S. Pat. No. 7,002,443, METHOD AND APPARATUS FOR COOLING MAGNETIC CIRCUIT ELEMENTS, filed on Jun. 25, 2003; and to U.S. application Ser. No. 10/606,412, now U.S. Pat. No. 7,101,203, entitled METHOD AND APPARATUS FOR ELECTRICALLY INTERCONNECTING HIGH VOLTAGE MODULES POSITIONED IN RELATIVELY CLOSE PROXIMITY, also filed on Jun. 25, 2003; application Ser. No. 10/036,727, now U.S. Pat. No. 6,865,210, entitled TIMING CONTROL FOR TWO-CHAMBER GAS DISCHARGE LASER SYSTEM, filed on Dec. 21, 2001; and to application Ser. No. 10/141,201, now U.S. Pat. No. 6,839,372, entitled GAS DISCHARGE ULTRAVIOLET LASER WITH ENCLOSED BEAM PATH WITH ADDED OXIDIZER, filed on May 7, 2002; and to application Ser. No. 10/356,168, now U.S. Pat. No. 6,963,595, entitled AUTOMATIC GAS CONTROL SYSTEM FOR A GAS DISCHARGE LASER, filed on Jan. 31, 2003; and to Ser. No. 09/848,043, now U.S. Pat. No. 6,549,551, filed on May 3, 2001, entitled INJECTION SEEDED LASER WITH PRECISE TIMING CONTROL; and to U.S. application Ser. No. 10/141,201, now U.S. Pat. No. 6,839,372, entitled GAS DISCHARGE ULTRAVIOLET LASER WITH ENCLOSED BEAM PATH WITH ADDED OXIDIZER, filed on May 7, 2002; and to Ser. No. 10/036,727, now U.S. Pat. No. 6,865,210, filed on Dec. 21, 2001, entitled TIMING CONTROL FOR TWO-CHAMBER GAS DISCHARGE LASER SYSTEM; and to U.S. application Ser. No. 10/012,002, entitled VERY NARROW BAND, TWO CHAMBER, HIGH REP RATE GAS DISCHARGE LASER SYSTEM, filed on Nov. 30, 2001, now U.S. Pat. No. 6,625,191; and to application Ser. No. 09/837,035, entitled HIGH REPETITION RATE GAS DISCHARGE LASER WITH PRECISE PULSE TIMING CONTROL, filed on Apr. 18, 2001, now U.S. Pat. No. 6,619,421; and U.S. Pat. No. 6,016,325, entitled MAGNETIC MODULATOR VOLTAGE AND TEMPERATURE TIMING COMPENSATION CIRCUIT; and U.S. Pat. No. 6,067,306, entitled LASER-ILLUMINATED STEPPER OR SCANNER WITH ENERGY SENSOR FEEDBACK, issued to Sandstrom et al. on May 23, 2000; and to U.S. application Ser. No. 09/451,995, entitled LONG-PULSE PULSE POWER SYSTEM FOR GAS DISCHARGE LASER, filed on Nov. 30, 1999; U.S. application Ser. No. 10/712,545, now U.S. Pat. No. 6,928,093, entitled LONG DELAY AND HIGH TIS PULSE STRETCHER, filed on Nov. 13, 2003; and to U.S. patent application Ser. No. 09/854,097, entitled FOUR KHZ GAS DISCHARGE LASER, filed on May 11, 2001; and to U.S. Pat. No. 6,128,323, entitled, RELIABLE, MODULAR PRODUCTION QUALITY NARROW-BAND HIGH REP RATE EXCIMER LASER; and to U.S. Pat. No. 6,067,311, entitled EXCIMER LASER WITH PULSE MULTIPLEXER; and Ser. No. 10/739,961, entitled GAS DISCHARGE LASER LIGHT SOURCE BEAM DELIVERY UNIT, filed on Dec. 17, 2003; and Ser. No. 10/712,688, entitled LASER LITHOGRAPHY LIGHT SOURCE WITH BEAM DELIVERY, filed on Nov. 12, 2003; and Ser. No. 10/425,361, entitled LITHOGRAPHY LASER WITH BEAM DELIVERY AND BEAM POINTING CONTROL, filed on Apr. 29, 2003; and Ser. No. 10/141,216, entitled LASER LITHOGRAPHY LIGHT SOURC3 WITH BEAM DELIVERY, filed on May 7, 2002; and Ser. No. 10/255,806, filed on Sep. 25, 2002, entitled LITHOGRAPHY LASER SYSTEM WITH IN-PLACE ALIGNMENT TOOL, now U.S. Pat. No. 6,704,340; and Ser. No. 10/233,253, entitled LITHOGRAPHY LASER WITH BEAM DELIVERY AND BEAM POINTING, now U.S. Pat. No. 6,704,339, the disclosures of all of which are hereby incorporated by reference.

The parent application Ser. No. 11/201,877 is also related to co-pending application Ser. No. 10/884,547, now U.S. Pat. No. 7,061,959, filed Jul. 1, 2004, contemporaneously with the parent application and entitled Laser Thin Film Poly-Silicon Annealing System, the disclosure of which is hereby incorporated by reference.

FIELD OF THE INVENTION

The present invention relates to pulsed lasers system for use in manufacturing processes involving treatment of surfaces and/or substrates with laser light over large areas and at high repetition rates, high power and pulse to pulse dose stability and more specifically to thin line optical pulse delivery systems.

BACKGROUND OF THE INVENTION

It is known to produced rows of cylindrical lenses, e.g., by grinding and polishing with a concave cylindrical rod and then turning the raster through 900 to produce cross-cylindrical lenses, which may be different from true axially symmetrical lenses in that they will be well below the diffraction limit for such extremely weak lenses, e.g., with 1 mm square aperture and 80 mm focal length. (www.eso.org/gen-fac/pubs/messenger/archive/no.114-dec03/mess-wilson.pdf)

JSW Corporation is known to offer an apparatus for performing crystallization of amorphous silicon thin films for the purpose of recrystallization of the amorphous silicon thin film into poly-crystalline silicon ("Poly-si" or "poly") for the purpose of making on a substrate, e.g., thin film transistors, e.g., for flat panel displays. This is known as excimer laser annealing "ELA") due to the utilization of an excimer, e.g., XeCl laser for the light energy source to do the ELA annealing with the resultant melting and recrystallization of the amorphous silicon to form the thin film poly layer, wherein, e.g., the thin film transistor gates are formed.

JSW has demonstrated a capability of working with substrates with, e.g., 370×470 mm surface areas and 730×920 surface areas, with the former being worked with a tool having a beam size of 365×0.4 mm, an excimer laser repetition rate of 300, an overlap of 95%, a scan pitch of 0.02, a scan length of 470, a number of scan equal to 1, performing a total of 23500 crystallization shots per sheet, with a crystallization time of 78 seconds per sheet utilizing 21390 wasting shots per screen, resulting in 44,890 total shots per screen and a 150 second time of actuation per screen for a throughput of 24.06 screens per hour, with similar numbers in the later case resulting in 2 scans to cover the sheet in the second case with the wider (920 mm) sheet, a 157 second per sheet crystallization time, 16698 wasting shots per sheet 229 seconds time of actuation and a 15.70 sheets per hour throughput. Lambda Physik offers a machine with roughly similar capabilities.

H. Kahlert, et al., "High-resolution optics for thin Si-film crystallization using excimer lasers: present status and future development," Proc. or SPIE-IS&T, Electronic•Imaging, SPIE Vol. 5004 (2003), pp. 20-27 ("Kahlert") discusses forming a several hundred μm wide by 370 mm long beam at the workpiece for super-lateral-growth•("SLG") crystallization. Also discussed is sequential lateral solidification as is also discussed in a number of patents issued to Im, including U.S. Pat. No. 6,322,625, issued on Nov. 27, 2001, entitled CRYSTALLIZATION PROCESSING OF SEMICONDUCTOR FILM REGIONS ON A SUBSTRATE, AND DEVICES MADE THEREWITH, based on U.S. application Ser. No. 09/200,533, filed on Nov. 27, 1998; and U.S. Pat. No. 6,368, 945, issued on Apr. 9, 2002, entitled METHOD AND SYSTEM FOR PROVIDING A CONTINUOUS MOTION SEQUENTIAL LATERAL SOLIDIFICATION, based on U.S. application Ser. No. 09/526,585, filed on Mar. 16, 2000; and U.S. Pat. No. 6,555,449, issued to Im et al. on Apr. 29, 2003, entitled METHODS FOR PRODUCING UNIFORM LARGE-GRAINED AND GRAIN BOUNDARY LOCATION MANIPULATED POLYCRYSTALLINE THIN FILM SEMICONDUCTORS USING SEQUENTIAL LATERAL SOLIDIFICATION, based on U.S. application Ser. No. 09/390,535, filed on Sep. 3, 1999; and U.S. Pat. No. 6,563,077, issued on May 13, 2003, entitled SYSTEM FOR PROVIDING A CONTINUOUS MOTION SEQUENTIAL LATERAL SOLIDIFICATION, based on U.S. application Ser. No. 09/823,547, filed on Mar. 30, 2001; and U.S. Pat. No. 6,573,53, issued to lm, et al. on Jun. 3, 2003, entitled SYSTEMS AND METHODS USING SEQUENTIAL LATERAL SOLIDIFICATION FOR PRODUCING SINGLE OR POLYCRYSTALLINE SILICON THIN FILMS AT LOW TEMPERATURES, based on U.S. application Ser. No. 09/390,537, filed on Sep. 3, 1999; and U.S. Pat. No. 6,582, 827, issued on Jun. 24, 2003, entitled SPECIALIZED SUBSTRATES FOR USE IN SEQUENTIAL LATERAL SOLIDIFICATION PROCESSING, based on U.S. application Ser. No. 09/722,778, filed on Nov. 27, 2000, and also discussed in United States Published Patent Application Nos. 2003/0096489A1, with inventors Im, et al., published on May 22, 2003, entitled METHODS FOR PRODUCING UNIFORM LARGE-GRAINED AND GRAIN BOUNDARY LOCATION MANIPULATED POLYCRYSTALLINE THIN FILM SEMICONDUCTORS USING SEQUENTIAL LATERAL SOLIDIFICATION, based on U.S. application Ser. No. 10/294,001, filed on Nov. 13, 2002; and 2003/0119286A1, with inventors Im, et al., published on Jun. 26, 2003, entitled METHOD FOR PRODUCING UNIFORM LARGE-GRAINED AND GRAIN BOUNDARY LOCATION MANIPULATED POLYCRYSTALLINE THIN FILM SEMICONDUCTORS USING SEQUENTIAL LATERAL SOLIDIFICATION, based on U.S. application Ser. No. 10/308,958, filed on Dec. 3, 2002.

Additional patents discuss aspects of such thin film crystallization, including, U.S. Pat. No. 5,432,122, issued to Chae on Jul. 11, 1995, entitled METHOD OF MAKING A THIN FILM TRANSISTOR BY OVERLAPPING ANNEALING USING LASERS, based on an U.S. application Ser. No. 08/147,635, filed on Nov. 3, 1993; and U.S. Pat. No. 6,177, 301, issued to Jung on Jan. 23, 2001, entitled METHOD OF FABRICATING THIN FILM TRANSISTORS FOR A LIQUID CRYSTAL DISPLAY, based on an U.S. application Ser. No. 09/311,702, filed on May 13, 1999; and U.S. Pat. No. 6,316,338, issued to Jung on Nov. 13, 2001, entitled LASER ANNEALING METHOD, based on an application Ser. No. 09/605,409, filed on Jun. 28, 2000; and U.S. Pat. No. 6,215, 595, issued to Yamazaki et al. on Apr. 10, 2001, entitled APPARATUS AND METHOD FOR LASER RADIATION, based on an U.S. application Ser. No. 09/583,450, filed on May 30, 2000; and U.S. Pat. No. 6,300,176, Issued to Zhang et al. on Oct. 9, 2001, entitled LASER PROCESSING METHOD, based on an U.S. application Ser. No. 08/504,087, filed on Jul. 19, 1995; and U.S. Pat. No. 6,396,560, issued to Noguchi et al. on May 28, 2002, entitled METHOD OF PRODUCING LIQUID CRYSTAL DISPLAY PANEL, based on an U.S. application Ser. No. 09/667,758, filed on Sep. 21, 2000, and United States Published Patent Application 2004/0060504A1, with inventors Takeda et al., published on Apr. 1, 2004, entitled SEMICONDUCTOR THIN FILM AND PROCESS FOR PRODUCTION THEREOF, based on U.S. application Ser. No. 10/462,792, filed on Jun. 17, 2003.

Kalhert notes that the prior art is limited to a laser pulse dimension, line-width, at the workpiece of 400 μm in the prior art.

FIG. 1 shows an optical layout discussed in Kahlert for a Lambda Physik ELA machine. Turning to FIG. 1 it can be seen that the assembly 20. The assembly 20 comprises a laser output beam 22, e.g., the output of a XeCl LS 1000 excimer laser made by Lambda Physik. The laser beam 22 is passed through an attenuator 24, which comprises a pair of attenuator plates 26. The beam 22 is then expanded in the long axis by a long axis expansion optic 30, including a first telescope lens 32 and a second telescope lens 34, together forming an expanding telescopic element in the long axis of the beam 22. The beam is then passed through a long axis homogenizer 40 consisting of a first row of cylindrical lenses 42 and a second parallel row of cylindrical lenses 44, the cylindrical lenses of the first row 42 each having a focal point at a selected distance there between in the long axis, followed by an imaging lens 46, imaging the long axis of the beam. The beam is then passed through a short axis homogenizer 50, including a first row of cylindrical lenses 52 and a second row of cylindrical lenses 54, with each lens of the first row 52 having a focal point at a selected distance there between, and followed by an imaging lens 56, imaging the beam in the short axis at a slit 62 formed in a field stop 60, also including a field lens 64. The widened beam 80 is then rotated 90° by a mirror 90, having, a 90% reflectivity and then passed through a beam short axis magnifier 100, consisting of a 5× magnification cylindrical doublet having a first lens 102 and a second lend 104, which forms the final ELA beam 120 on or about the substrate 130. The prior art assembly 20 may also have a beam quality monitoring system 110 including a first CCD camera 112 and a second CCD camera 112.

FIG. 2 is an illustration of only the short axis optical assembly components of the assembly 20 of FIG. 1 and illustrates the utilization in the prior art Lambda Physik or JSW ELA machines of two laser beams 22, 22' originating from two single chamber Lambda Physik single oscillator excimer lasers, e.g., an XeCl laser or a KrF excimer laser. Also illustrated is the fact that the short axis imaging of the beam at the field stop 60 overlaps so that only part of the energy in the combined overlapped beam profiles passes through the slit 62.

FIG. 3 shows a possible lens combination 30 for both magnifying the beam in the short axis and expanding the beam in the long axis, which may comprise, e.g., a cylindrical convex lens 32 followed by a cylindrical concave lens resulting in a ling shaped beam 120 thinned in the axis of a scanning direction and elongated orthogonally to the scanning direction.

FIG. 4 shows an example of a lens assembly illustrative of the effect of beam homogenization carried out in the long axis beam homogenizer 40 and the short axis beam homogenizer 50 according to aspects of an embodiment of the present invention, including a substrate 140, which may be made of a suitable material capable of optically tolerating the DUV light at the required intensity levels, e.g., $MgF_2$ or $CaF_2$ with a thickness of, e.g., about 1.2 mm and on wither side arrays of cylindrical refractive, plano-convex cylindrical microlenses, with, e.g., a lens pitch in the array of, e.g., about 300 microns, resulting in a divergence angle of, e.g., about 1°, and a far-field flat-top intensity distribution. Such a lens assembly may be obtained, e.g., from Suss Microoptics sold under the designation CC-Q-300 1°, 5 mm×10 mm, High Power Beam Homogenizer.

A. Voutsas, et al., "Effect of process parameters on the structural characteristics of laterally grown, laser-annealed polycrystalline silicon films," Jour. of Appld. Phys., Vol. 94, No. 12 (Dec. 15, 2003) ("Voutsas"), the disclosure of which is hereby incorporated by reference, notes the importance of the parameter of beam profile, particularly in the short axis of the beam in regard to lateral crystal growth. This is, as Voutsas notes, primarily determined by the relationship between the critical size of the beam shaping pattern, Le., approximately the width in the case of a large aspect ratio rectangle and the resolving power of the projection optics, i.e., approximately the numerical aperture of the projection lens. This relationship determines the edge "sharpness" of the beam profile, i.e., the spatial requirement for the intensity to rise from, e.g., about 10% to about 90% of full intensity. Efficient SLS processes can require an abrupt beam-edge profile to minimize the inefficient utilization of laser energy as explained in more detail in Voutsas. In practice, this profile can be dictated by the diffraction limit of the projection optics due to the compromise between numerical aperture and depth-of focus requirements. FIG. 4 shows a typical prior art spatial intensity distribution on a substrate in the short axis of the beam and the portion selected, e.g., by the optics discussed above to provide, e.g., an 8-9 µm wide beamlet generated from a 5:1 projection lens with numerical aperture of approximately 50.05. The intensity range corresponding to the SLS process window is also shown in Voutsas. For intensity values outside this range, partial melting of the film can occur with the subsequent formation of fine grain poly-Si material where the intensity is too low. The sharpness of the beam profile, therefore, can define-the extent of this regime at each edge of the beam (de). Depending upon the width of the beamlet, also random nucleation may occur at the center of the beam, if the LGL under the irradiation conditions is smaller than about half of the beam width. Voutsas also notes that if dL is the lateral growth length and dc is the width of the central, nucleated region:

$$w=2de+2dl+dc$$

where w is the beam width. Voutsas also notes, that for optimum utilization of the beamlet, it is required that de-→0 and dc-→0. Also according to Voutsas, the nucleated, "center" region can be effectively eliminated, e.g., by essentially decreasing the beamlet width, while the beam edge region may be restricted but never practically eliminated. Voutsas also points out that in addition to the limitations of the projection optics, another source of beam-profile distortion is focusing. For a given numerical aperture for the projection optics, the depth-of-focus can be determined, defining, e.g., the degree of variation in the distance between the projection lens and the surface of the irradiated sample that results in essentially negligible changes in the imaging capability of the lens, i.e., its resolving power. For example, if, for a given projection lens, the location of the sample plane exceeds this limit in depth-of-focus, distortion in the imaged beam profile can occur, e.g., manifesting itself as "blurring;" i.e., the imaged beam cannot be fully resolved, with either underfocus and overfocus. Under such conditions according to Voutsas, the maximum beam intensity decreases and the edge becomes more diffuse, e.g., has a less steep or abrupt slope. In other words, de increases and the probability of nucleation at the center of the beamlet also increases. Voutsas also notes the variation of LGL as a function of the degree of defocusing in mm from the best focal plane, e.g., the lateral growth length being reduced with defocusing, due to the increased edge diffusion in the beam profile, which can render an increasing part of the beam ineffective for lateral growth. Also noted is edge length variation as a function of defocusing, wherein the decrease in lateral growth length can be accompanied by a concomitant increase in the edge length, at increased defocusing. Voutsas indicates that increasing the laser fluence can somewhat compensate for the defocusing losses on LGL, however, agglomeration can pose a limitation as to the extent of such compensation, indicating that distortions in the beam profile, e.g., due to defocusing may have to be accounted for in determining the optimal substrate pitch to maintain for lateral growth continuity over large areas.

Glass substrates for AMLCD manufacture using ELA are known to include, e.g., Coming® 1737 AMLCD glass substrates, as described in Corning's MIE 101 (August 2002), 1737 display grade glass substrates, as described in Coming's PEI 101 (December 2002), Eagle$^{2000}$™ display grade glass substrates, as described in Corning's PIE 201 (December 2002) and "Glass substrates for AMLCD Applications: Properties and Implications," TIP 101, February 2002) and "Support Designs for Reducing the Sag of Horizontally Supported Sheets," TIP 303 (February 2003), the disclosures of which are hereby incorporated by reference.

FIG. 4 shows schematically a process flow for the preparation of the excimer laser annealed ("ELA") poly-Si films according to the prior art. K. Lee, A Study on Laser Annealed Polycrystalline Silicon Thin Film Transistors (TFTs) with SiNx Gate Insulator, Chapter 5, Electrical and Structural Properties of ELA Poly-Si Films, tftlcd.khu.ac.kr/research/poly-Si/chapter5.html. As shown in FIG. 4 an XeCl excimer laser system (not shown) with a rectangular beam shape, in an annealing apparatus provided by, e.g., JSW Corporation can be used. A buffer layer 134 of SiO$_2$ is deposited on the clean glass substrate 132 by APCVD. A 70 nm thick amorphous-Silicon: hydroxide ("a-Si:H") film 136 is deposited by PECVD as a starting material for the ELA. The a-Si:H film is dehydrogenated by an excimer laser with 94% overlap scanning at 150 mJ/cm$^2$ to form a layer of amorphous-silicon 138. Finally, the dehydrogenated a-Si layer 138 is crystallized by ELA with 94% overlap scanning at 300° C. to form a poly-silicon layer 138. The laser energy density can be varied 240–330 mJ/cm$^2$ to find an optimum laser intensity to obtain a high quality poly-Si film 138.

The JSW ELA system has relatively simple optics for crystallization and activation but produces a microstructure that is small grained and has a TFT mobility performance of only about 100 and a throughput of only 25 sheets per hour, a relatively high maintenance cost per sheet and process margins that are energy sensitive though focus insensitive. The JWS 2 Shot SLS system has relatively complex optics for crystallization, produces 2-3 µm grains and a mobility of between about 150 and 200, with a throughput of 35 sheets per hour. It has a maintenance cost per sheet that is about 32% cheaper than the JWS ELA, and has process margins that are energy insensitive but focus sensitive.

FIG. 5 shows a beam profile having, about a 9 µm beam linewidth.

It is also known that for such applications to utilize excimer lasers, e.g., inert gas halide lasers, with the laser-active material composed of an inert gas atom and a halide atom (Cl, I, F etc.). Also rare gas halide lasers, such as XeCl, XeF, KrF and ArF, have been demonstrated and utilized effectively in recrystallization of Si film as indicated in J. J. Ewing, et al., Phys. Rev. A12, 129 (1975) and M. Hoffman, et al., Appl. Phys. Lett. 9,538 (1976), including common types of such lasers as listed in the reference including XeF. The reference also notes that to crystallize an a-Si:H, many excimer lasers have been used such as ArF (193 nm), KrF (248 nm), XeCl (308 nm), XeF (351 nm). Among them, XeCl excimer lasers have the advantages of good gas stability, high absorption coefficient for the a-Si:H film at near wavenumber of 308 nm. Therefore, many companies adopt the XeCl laser for the production because of stable operation and high absorption coefficient for a-Si:H (~10$^6$ cm$^{-1}$) at 308 nm. K. Lee, A Study on Laser Annealed Polycrystalline Silicon Thin Film Transistors (TFTs) with SiNx Gate Insulator, Chapter 4, Experimental Details, tftlcd.kyunghee.ac.kr/research/poly-Si/chapter4.html C. Kim, et al., "Excimer-Laser Crystallized Poly-Si TFT's with Transparent Gate, IEEE Transactions on Electron Devices, Vol. 43, No. 4 (April 1996), p. 576-579 ("Kim"), discusses the utilization of XeF laser light irradiation on the glass substrate side of an amorphous silicon thin film on glass composite to form a poly-silicon transparent gate electrode in the amorphous silicon adjacent the glass substrate amorphous silicon interface. Also discussed in sht use of this technique for forming such transistors for driver monolithic active matrix-liquid crystal displays ("AM-LCDs"). Kim points out that top side annealing of the amorphous silicon is done with excimer lasers, including XeCl and others, citing K. Sera, et al., "High-performance TFT's fabricated by XeCl excimer laser annealing of hydrogenated amorphous-silicon film," IEEE Transactions on Electron Devices, Vol. 36, Np. 12, (1989), pp. 2868-72; Y. Morita, et al., "UV pulsed laser annealing of Si implanted silicon film and low-temperature super thin-film transistors," Jpn. J. Appl. Phys., Vol. 28, No. 2 (1989) pp. L309-L311; K. Shimizu, et al., "On-Chip bottom gate polysilicon and amorphous silicon thin-film transistors using excimer laser annealed silicon nitride gate," Jpn. J. Appl. Phys., Vol. 29, No. 10 (1990), pp. L1775-L1777; K. Shimizu, et al., "high-performance poly-si thin-film transistors with excimer laser annealed silicon nitride gate," Jpn. J. Appl. Phys., Vol. 32, No. 1B (1993), pp. 452-57; M. Furuta, et al., "Bottom-gate poly-si thin film transistors using XeCl excimer laser annealing and ion doping techniques," IEEE Trans. Electron Devices, Vol. 40, No. 14 (1993) pp. 1964-69; and Y. Sun, et al., "Excimer laser annealing process for poly-silicon TFT AMLCD application," Record of 1994 Int. Disp. Res. Conf. (1994), pp. 134-47, the disclosures of each of which is hereby incorporated by reference. However, Kim discloses and suggests the use of XeF only for through the substrate irradiation to form transparent bottom gates.

It is known to utilize image channels formed by rows of lenses with an intermediate image with each channel imaging a limited angular section with a superpositioning of the partial images performed by a spatial superposition in an image plane, requiring erect imaging and with only next neighbor superpositioning to avoid off-axis aberrations. mstnews 2/03, www.suss-microoptics.com/downloads/Publications/Miniaturization_of_Imaging_Systems.pdf.

The use of fly's eyes lenses for intensity redistribution of excimer laser beams is known, as discussed in Y. Ozaki, et al., "Cylindrical fly's eye lens for intensity redistribution of an excimer laser beam, Applied Optics, Vol. 28, Issue 1 (January 1989) p. 106, and B. Crowther, et al., "A fly's eye condenser system for uniform illumination," Proc. of SPIE, International Optical Design Conference 2002, Vol. 4832 (2002), pp. 4832-35.

SUMMARY OF THE INVENTION

A high energy, high repetition rate workpiece surface heating method and apparatus are disclosed which may comprise a pulsed XeF laser operating at or above 4000 Hz and producing a laser output light pulse beam at a center wavelength of about 351 nm; an optical system narrowing the laser output light pulse beam to less than 20 µm in a short axis of the laser output light pulse beam and expanding the laser output light pulse beam to form in a long axis of the beam a workpiece covering extent of the long axis; the optical system including a field stop intermediate the laser and the workpiece; the workpiece comprising a layer to be heated; wherein the optical system focuses the laser output light pulse beam at a field stop with a magnification sufficient to maintain an intensity profile that has sufficiently steep sidewalls to allow the field stop to maintain a sufficiently steep beam profile at the workpiece without blocking the beam profile at too high an intensity level 2. The apparatus may also have a high average power in the laser output light pulse beam as delivered to the workpiece and a line bow correction mechanism in a short axis optical assembly. The line bow correction mechanism may comprise a plurality of weak cross cylinders. The system may comprise a catadioptric projection system. The linewidth due to laser diffraction and divergence may be less than geometric limitations. The system may project adjacent peaks of the nominal XeF spectrum to improve overall depth of focus through the separate center wavelengths of each respective adjacent peak having a different focal plane at the workpiece. The system may comprise a line bow is correction mechanism within a field stop optical assembly correcting line bow at the field stop plane and within a workpiece projection optical assembly correcting line bow at the workpiece plane.

DETAILED DESCRIPTION OF PREFERRED EMBODIMENTS

Applicants propose a directional SLS system that has simple optics for crystallization and activation, produces or can produce essentially grains that extend the length of the workpiece, yielding a mobility of 200-400 and a throughput of 35 sheets per hour. The maintenance per sheet form applicants' proposed system is about 37 percent cheaper than the JWS ELA system and has process margins that are insensitive to energy or focus in comparison to the JWS systems.

Applicants propose for a sheet size of 370×470 the capability of utilizing part of a beam that will cover the sheet comprising the substrate in one scan with a 365×0.02 mm or smaller elongated thin beam and will cover a 730×920 sheet with a single scan of an elongated thin beam of 730×0.02 mm with a laser repetition rate or at least 4000 Hz, overlap of, e.g., 90%, scan pitch of, e.g., 0.002 mm, scan length of 470 mm, enabling in the former case 235,000 crystallization shots per sheet, a 59 second crystallization time, 173,200 wasting shots for a 43 second wasting time per sheet, and 408,200 total shots and a 102 second time of actuation, giving a throughput of 35.38 sheets per hour and in the latter case utilizing a single scan covering the entire 730 mm width of the sheet with similar numbers, excepting, e.g., an 80% overlap, resulting in 460,000 crystallization shots, a 115 second crystallization time, 9,959 wasting shots, for a total of 469,959 shots, and a 22.74 sheets per hour throughput. In each instance the throughput achievable according to aspects of embodiments of the present invention, even at a relatively slow rate of 4000 Hz is about the 45% improvement over the prior art.

Figure 6:
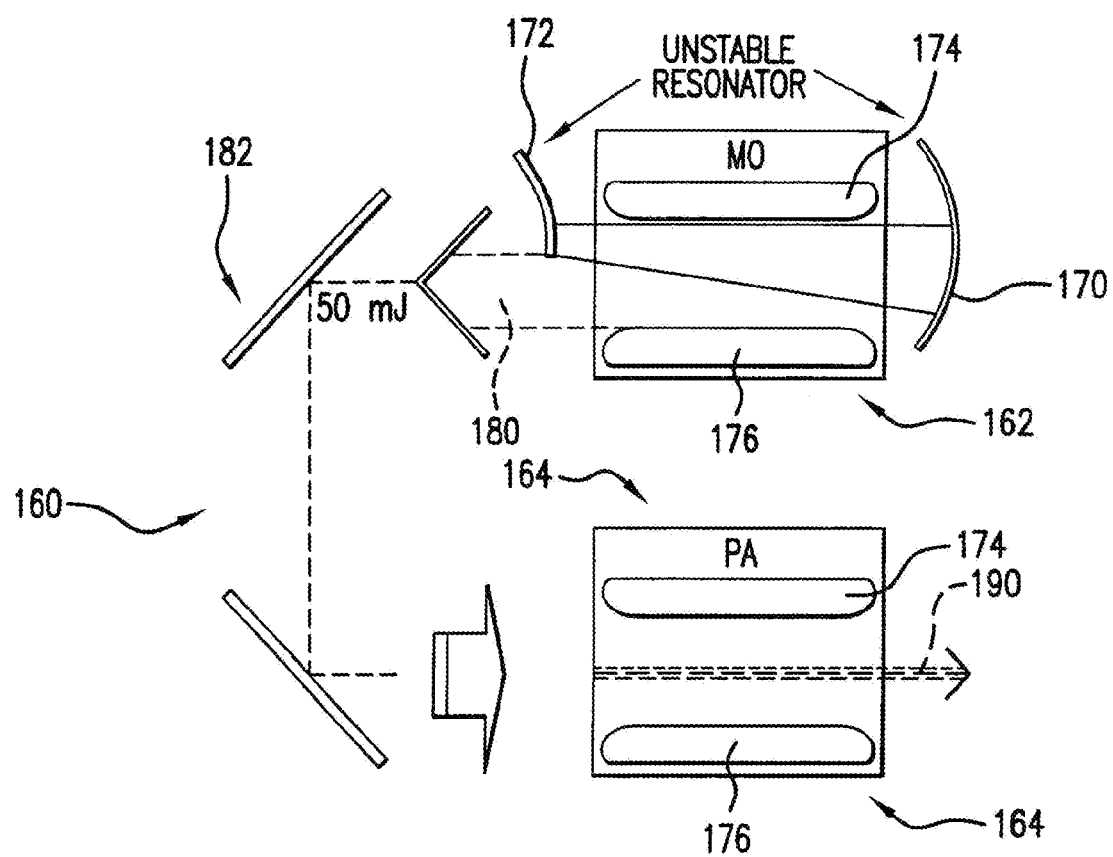
FIG. 6 shows schematically an illustrative pulsed laser output light beam producing system.

Turning now to FIG. 6 there is shown schematically an illustrative pulsed laser output light beam producing system 160 according to aspects of an embodiment of the present invention. The system 160 may include an oscillator laser system 162 and an amplifier laser system 164. The pulsed laser output light beam producing system 160 may be configured as a master-oscillator, power amplifier system in which the output pulse 180 of the oscillator system is line narrowed, e.g., with a line narrowing module or line narrowing package as is known in the art or may be a power oscillator in which line narrowing is not used. For purposes of this application both forms of oscillator laser are capable of being used and will be referred to as a master oscillator MO whether a master oscillator, MO, r power oscillator, PO. As illustrated in FIG. 6, the MO may comprises an unstable resonator, comprising a concave mirror 170 and a convex mirror 172, illustratively shown to be aligned for off-axis oscillation to produce an output beam 180 by electrical discharge between a cathode 174 and an anode 176 in the gas discharge chamber of the oscillator laser system 162.

The output beam 180, which may be about 50 mJ and of relatively low divergence, at least in one axis, e.g., the horizontal axis, due to the unstable resonator configuration of the oscillator chamber 162. This beam 180 is reflected by near total reflecting mirrors in a relay optic system 182 into the gas discharge chamber of the amplifier laser system 164, which may comprises a multi-pass power oscillator as is known in the art of MOPA laser systems such as those sold by applicants' assignee under the XLA series of model numbers. The beam 180 is amplified in intensity in the amplifier laser system 164 through a discharge between a cathode 174 and an anode 176 in the gas discharge chamber of the amplifier laser system 164 timed to the arrival of the beam 180 to produce a pulsed laser output light beam 190.

It will be understood that-the laser system 164 may be a multi-pass amplifier system with, e.g., one pass off-axis. In addition the amplifier laser system 164 could also be an oscillator system, e.g., configured also as an unstable resonator cavity or as a stable resonator cavity, to amplify the input beam 180 in a resonator laser cavity as a power oscillator.

Figure 7:
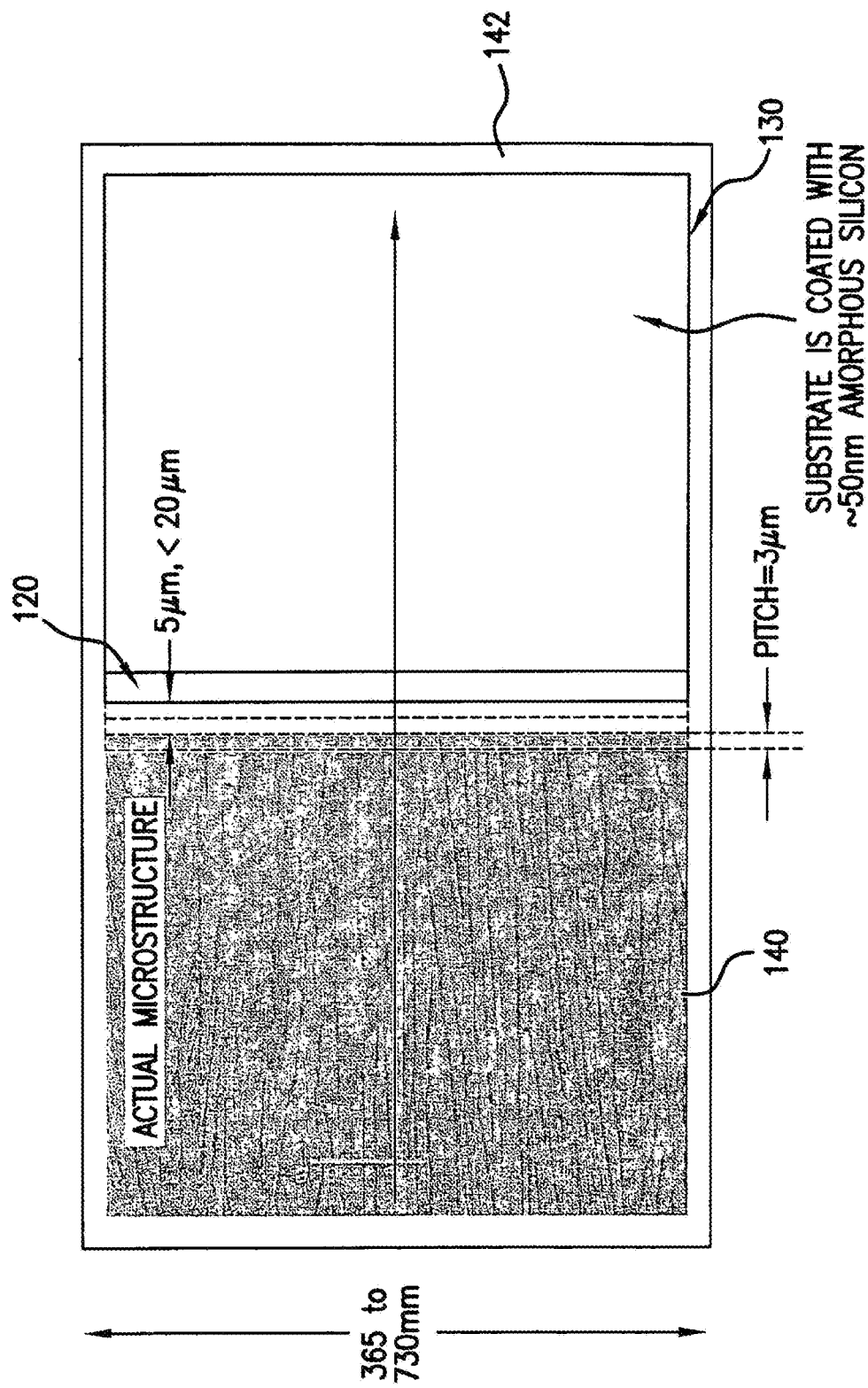
FIG. 7 shows partly schematically a system according to aspects of an embodiment of the present invention.

Turning now to FIG. 7 there is shown partly schematically a system according to aspects of an embodiment of the present invention. The workpiece 130 may comprise a thin film layer of a-Si 140 which may be scanned by an elongated thin beam, from, e.g., about 365 mm-730 mm long in a direction orthogonal to the scanning direction, i.e., sufficiently long to cover the desired length of the workpiece 130 in that dimension, with, e.g., some border which is not to be treated, as illustrated as an example in FIG. 7. The scan in the scanning direction may occur with each pulse of the pulse output laser light beam covering a crystallization zone according to the dimensions of the beam 120, e.g., 365 mm×5-20 μm with a pitch to insure overlap of the successive crystallization zones irradiated by the beam at each pulse, except as discussed below where pulses may be skipped, e.g., to intentionally arrest crystal at some desired length, with a fresh crystal growth then started with a subsequent pulse.

For example, with a 5 μm linewidth for the pulse in the scanning direction, a 3 μm pitch may be selected, which will then give an overlap of about 40% of the linewidth of the pulse in the scanning direction from pulse to pulse.

For a required energy density of approximately 1 J/cm$^2$ at the workpiece for SLS, and a beam of 730 mm×0.01 mm, this would require 73 nJ and assuming a transmission rate of 70% from the laser to the work stage, would require. at least 100 mJ from the laser. a beam repetition rate of 4 KHz and a scan pitch of, e.g., 2 μm/pulse would require a stage scanning speed of 2 μm*4 KHz=8 mm/s.

According to aspects of an embodiment of the present invention the spatial beam intensity profile should be maintained as sharp as possible, i.e., with the slope of the side walls of the profile from about 10% of the intensity at the sidewall to about 90% of the intensity of under about 0.2 µm for a 10 µm pulse width (FWHM), i.e., a slope of about >9. Where the beam profile is not steep enough there can be shorter lateral growth distance and variations in the total width of the crystallization region in the direction of the scan, due to energy density fluctuations that result in crystallization region (zone) fluctuations.

FIG. 7 illustrates that there may be occasions where the full length or width of the workpiece may not be treated, e.g., a border 142 may be intentionally left at the ends of the workpiece before and after the first and after the last scanned crystallization zones, or along the edges beyond the longitudinal extent of the beam generally orthogonal to the scanning direction. The term full extent of the workpiece as used herein means this extent of desired coverage of the workpiece, e.g., for crystallization, regardless of whether all of the workpiece per se is actually treated, e.g., to form the desired crystallization on the desired portion of the workpiece in length and width in one scan with an elongated thin beam according to aspects of the present invention.

Figure 8:
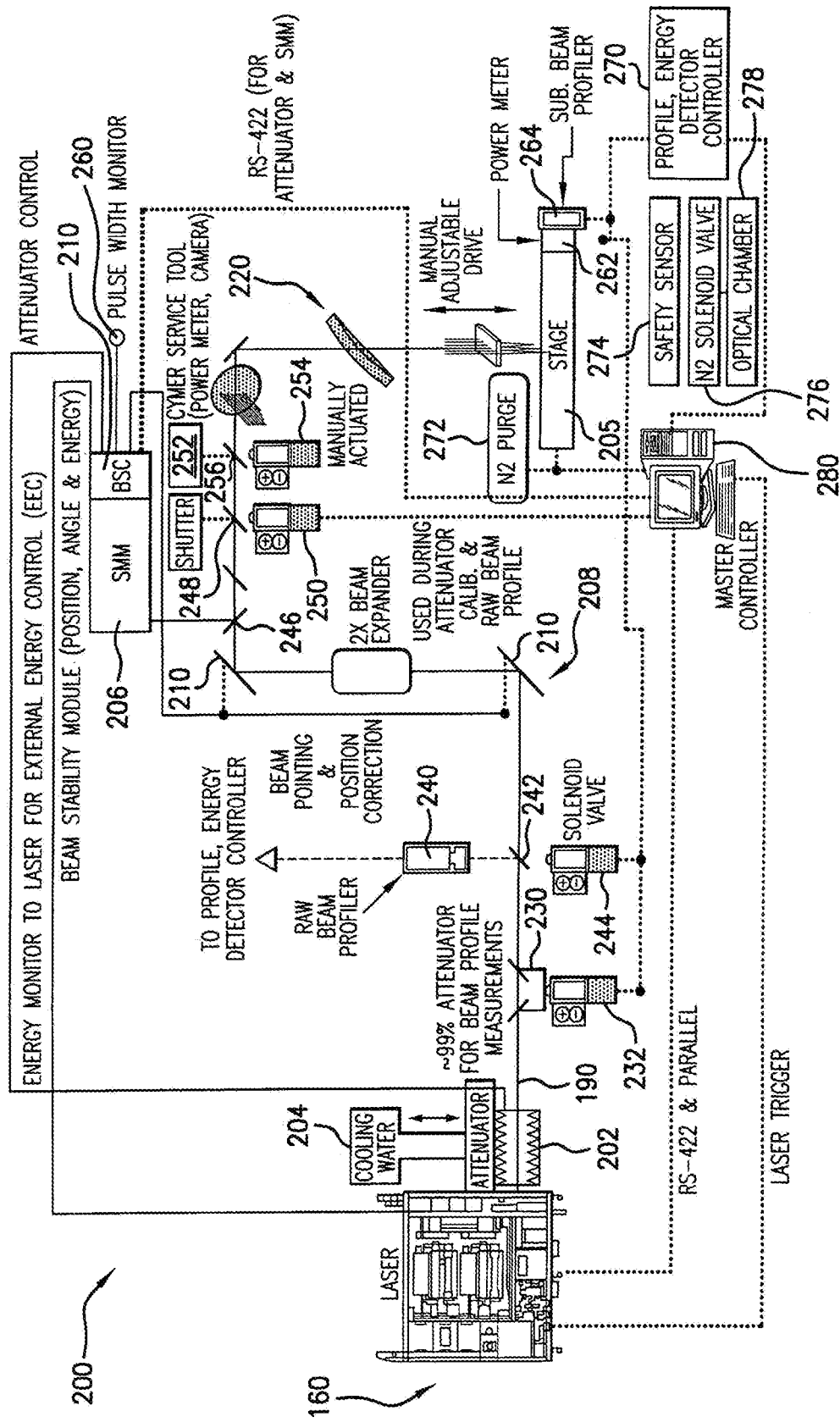
FIG. 8 shows schematically aspects of embodiments of the present invention.
Figure 9:
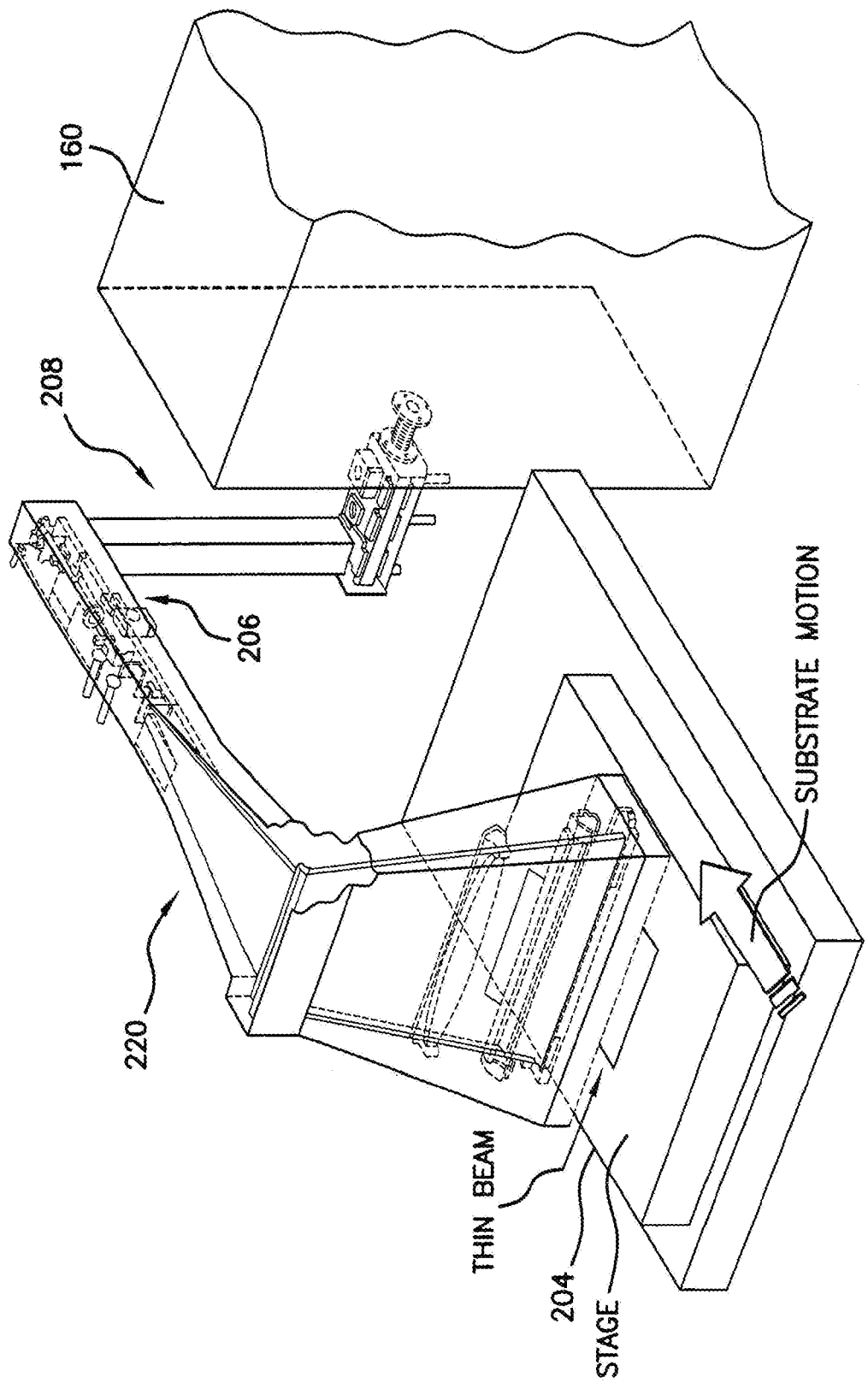
FIG. 9 shows schematically aspects of embodiments of the present invention.

Turning now to FIGS. 8 and 9 there is shown according to aspects of embodiments of the present invention a beam delivery and beam treatment system 200 useful according to the present invention. The system can take the pulsed laser output light beam 190 and deliver it to a workpiece, e.g., on a work stage 204 through a beam delivery unit 208 and a beam treatment unit 220. The beam delivery unit 208 may have a beam stability metrology module 206, which may measure beam position and pointing and also beam energy and provide active feedback control to turning mirrors 210 in the BDU 208.

The system may include an attenuator 202 operating in feedback control to attenuate the beam 190, e.g., by about 5%-50% for dose control at the workpiece 130 on the work stage 205. The attenuator 202 may include a cooling unit 204. The system 200 may also-have a beam stability metrology module ("SMM") 206 along with a beam stability control module 210 ("BSC") 210. The output of the BDU 208 is received by the beam treatment module 220.

Also in the path of the beam 190 may be beam attenuator 230 which may be inserted into and withdrawn from the path of the beam 190 within the BDU 210 by an operating solenoid 232. This may be used to attenuate the beam, e.g., by up to about 99% to allow for downstream metrology at lower beam power levels. A raw beam profiler 240 may be utilized to profile the bean near the laser system 160 by inserting into the path of beam 190 a beam splitter 242 using a beam splitter operating solenoid 244.

A beam splitter 246 may be utilized to divert a small portion of the beam 190 into the SMM 206, where metrology may be performed on the beam 190 just before entry into the beam treatment module 220. The SMM may monitor beam position, pointing (angle) and energy and provide information regarding these parameters to the BSC and/or to a main controller 280 comprising, e.g., a programmed computer processor which may also be in communication, e.g., over a network link, e.g., an RS-422, with the laser system 160, the BSC 210 and a workpiece profile and Energy detector/controller 270. The BSC may be in direct communication with the laser and attenuator for external laser output energy control and for attenuation control and may also have an output to a pulse width monitor 260.

A service tool, e.g., for measuring the beam, e.g., with a camera of a power meter, may be manually inserted into the path of the beam 190 before entry into the beam treatment module 220 by using a beam splitter 256 inserted into the path of the beam 190 by an operating solenoid 254 that may be manually operated.

The system may also have a nitrogen purge module 272 that may serve to purge one or more of the BDU 208 beam path, the beam treatment module 220 and the work stage 205.

A safety sensor 274 may operation in conjunction with an $N_2$ solenoid valve to purge the beam treatment module and/or the work stage 205.

A shutter 248 may be placed in the path of the beam 190 to prevent the beam 190 from entering the beam treatment module 220.

Without active beam stabilization, e.g., feedback control of the turning mirrors 210 in the BDU 208, beam pointing drift can be excessively large, e.g., as much as 100 to 200 µrad. With, however, stabilization Control On, the deviation can be kept, e.g., to about ±25 µrad of some target, which can be done independently of the effects of laser duty cycle. Without active feedback control of beam parameters, e.g., pointing and angle, a relatively rapid deviation, e.g., pointing deviation can occur, at least in part due to duty cycle variations, i.e., up to around 200 µrad, with, e.g., a ±50 µrad variation between bursts. It will be understood that in operation the system 200 can provide metrology and control in the form of beam profile and power at the laser exit, active beam drift (angle and position) correction using Stabilization Metrology Module (SMM), energy sensor feedback to maintain energy stability throughout beam delivery, beam treatment and bean utilization, profile monitoring at substrate on the work stage; profile monitor feedback to the beam delivery optics to optimize beam at substrate on the work stage; and power monitor feedback to the laser from an energy monitor at the work stage and in the SMM.

The system is capable of operation with parameters, e.g., a working length of at least 920 mm, if necessary, line width resolution<0.05 µm, mono-directional repeatability of <±0.25 µm, accuracy of <±1 µm and an autofocus system for ~20 µm.

According to aspects of an embodiment of the present invention, the SMM functions to measure beam pointing and position and programmed controller (not shown) in the BSC computes respective error signals, which are then utilized by the main controller 280 to control such things as laser energy output, the laser trigger(s) and the attenuator 202. As shown in Table I for a fixed N.A. at the workpiece changes in reductions result in equivalent systems.

TABLE I

| Parameter | Reduction | | |
| --- | --- | --- | --- |
| | 5x | 10x | 20x |
| NA workpiece | 0.170 | 0.170 | 0.170 |
| Back focus | 100 mm | 100 mm | 100 mm |
| NA mask | 0.034 | 0.0170 | 0.0085 |
| Short axis efl | 100 mm | 200 mm | 400 mm |

TABLE I-continued

| Parameter | Reduction | | |
|---|---|---|---|
| | 5x | 10x | 20x |
| Short axis pitch | 700 μm | 700 μm | 700 μm |
| Linewidth mask | 110 μm | 220 μm | 440 μm |
| Linewidth geo. | 22 μm | 22 μm | 22 μm |
| Linewidth diff. | 24 μm | 24 μm | 24 μm |
| Number of cells | ~10 | ~10 | ~10 |
| Length | ~1700 mm | ~2200 mm | ~3200 mm |
| Mask dimension | 150 mm × 100 μm | 150 mm × 200 μm | 150 mm × 400 μm |
| (energy density) | (700 mJ/cm^2) | (350 mJ/cm^2) | (175 mJ/cm^2) |

According to aspects of the present invention a bowtie effect is created, i.e., an expansion of the beam in the short axis of the beam towards the longitudinal ends of the beam in the long axis of the beam. For a 5-20/μm beam in the short axis, at the beam ends, e.g., at ±182.5 mm the, e.g., 20 μm grows to, e.g., between about 40 μm and 60 μm. Such a beam expansion for a beam of 400 μm linewidth in the short axis is negligible. However, according to aspects of an embodiment of the present invention this beam growth of between about 2× and 12×, depending on beam linewidth in the center of the long axis of the beam is not acceptable. A split LSF could be made with much less line bow effect. The performance at the bean longitudinal ends deteriorates in several ways, including line width growth on the long axis, loss of long axis uniformity and loss of integrated efficiency through the mask plane. This will place long axis uniformity, dose at the line ends and stability and also throughput out of specification in an elongated thin beam ELA system according to aspects of an embodiment of the present invention.

This line bow is generated at least by two factors, including geometric length and the skew ray interaction between the long and short axis of the beam, i.e., the interaction of long axis generation and short axis focusing at the mask plane. Applicants propose to decrease the undesirable impact of the line bow effect by utilizing a synthesized "potato chip" lens that differentially refracts the beam according to distance from the center of the long axis, e.g., with a pair of weak (low power) crossed cylindrical lenses positioned at the output of the short axis field optic. Other contributory factors to the line bow are believed to be obliquity at the short axis reduction lens and obliquity within cells of the short axis array, which are believed to be correctable or at leased reduced in adverse impact through vignetting at the focus of the short axis.

Non-uniformity may also be the result of speckle created by interference due to beam coherence, which may not be such a problem for more highly divergent lasers which may not suffer from such speckle and coherence problems. Reduction is such interference effects may be achieved With a distributed delay device, e.g., a synthesized "potato chip" lens. Distributed delay devices have been known as indicated by P. Dainesi, "Optimization of a beam delivery system for a short-pulse KrF laser used for material ablation," Applied Optics (1997) Vol. 36, No. 27, the disclosure of which is hereby incorporated by reference.

Applicants propose a system with, e.g., a 365 mm×5-20 μm bean size at the workpiece, e.g., with a field of view of, e.g., 18 mm and an energy density without pulse stretching of 400-1000 mJ/cm$^2$ and >600 mJ/cm$^2$ with pulse stretching, with the capability of running at about a 755 duty cycle. Also the system contemplated can, e.g., have an N.A. of, e.g., 0.13 and a demagnification of between 20 and 5 with a DOF of, e.g., >±10 μm, @ 2.0 μm L/S pattern and an attenuator transmittance between 10% and 100% and an attenuator stability of <0.5% for manual mode operation. The present invention is also capable of use with masks of a size, e.g., of 5 or 6 inches with a mask thickness of 120 mil and manual or automatic (optional) alignment and x,y,z travel of 1160 mm×400 mm×1 mm, with a resolution of x=0.1 μm, y=0.02 μm and z=0.5 μm, and an accuracy of <±1.0 over the full range of travel and a travel speed of up to about 500 mm's. Also contemplated is a theta travel of 1.0°. Also contemplated are pulse energies of at least 77 mJ/pulse, repetition rates of at least 4 kHz, power of 300 W, output wavelength on about 351 nm, utilizing the double peak for XeF at about 351 and the secondary peaks for XeF on either side of about 351, and a pulse width of about 29±5 ns (FWHM), e.g., 30 ns, e.g., for two pulses 100 ns apart or ≧: 200 ns (FWHM) and gas lifetime of about 40×10$^6$ pulses or more.

A linear polarization is preferred so as to simplify the sampling of the beam. a beam width entering the first homogenizer is contemplated to be 30 mm×30 mm with the beam near diffraction limited in the short axis, e.g., for a 10 μm beam at the workpiece and spatial coherence resulting from spoiling in the short axis and a beam stability of ±2% to meet a 15% uniformity target at, e.g., 150 mJ.

A beam delivery unit transmission percentage of 72.30% and a pulse stretcher pulse transmission percentage of 65.36 percent is contemplated with a scan length of 0.01 mm and scan width of 730 mm and an overlap of 75-80% of the scan linewidth in the direction of the length of the scan. These can be achieved with a laser, e.g., with a minimum energy of 154 mJ and 618 W of power.

A depth of focus of >100 μm (±50 μm) and image field curvature of <20 μm (±10 μm and a beam homogeneity of <10% (±5%) in the long axis and <5% (±2.5%) and a beam steepness of <10 μm (10%-90%) is contemplated. It will be understood in operation that applicants have addressed two critical aspect relating to proper SLS performance with an elongated thin beam, i.e., horizontal beam divergence, being addressed with, e.g., low power crossed cylindrical lenses aiming at 0.15 mrad @ 1/e$^2$ and with a lower divergence beam from the laser initially, facilitating achieving the required spot size of 10 to 20 μm at the substrate, and also horizontal beam pointing to maintain horizontal slope of <10 μm, i.e., 50 μrad, which is achieved by fast acting active beam steering, e.g., in the BDU.

Figure 1:
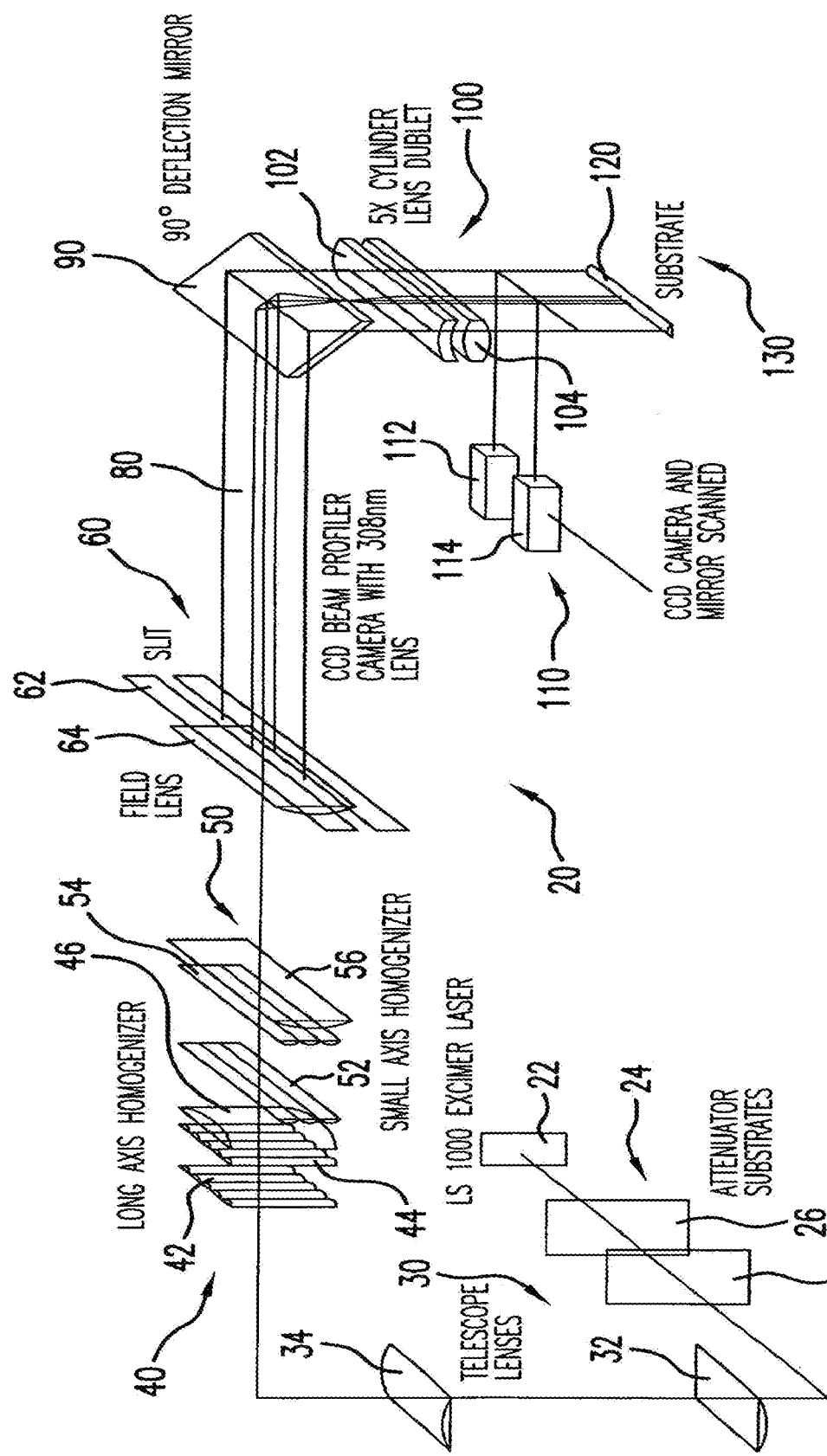
FIG. 1 shows an optical layout illustrative of aspects of an optical system according aspects of an embodiment of the present invention.
Figure 2:
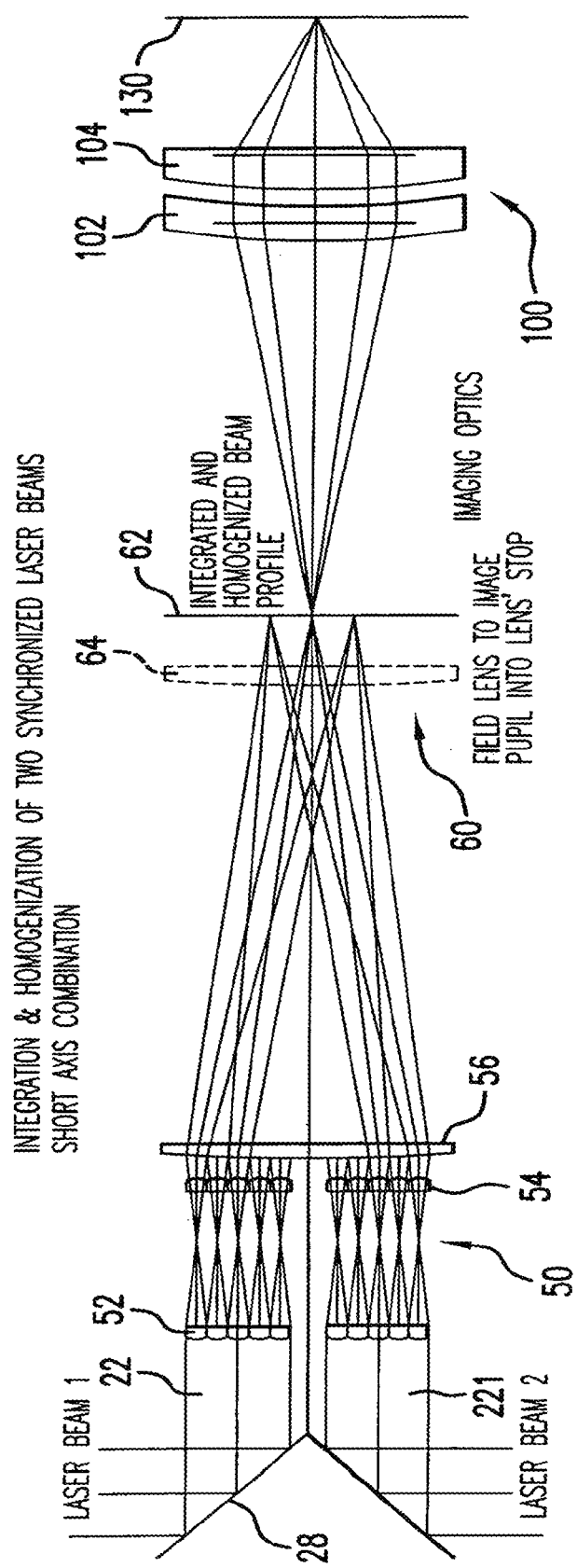
FIG. 2 shows another view of the optical system of FIG. 1.
Figure 3:
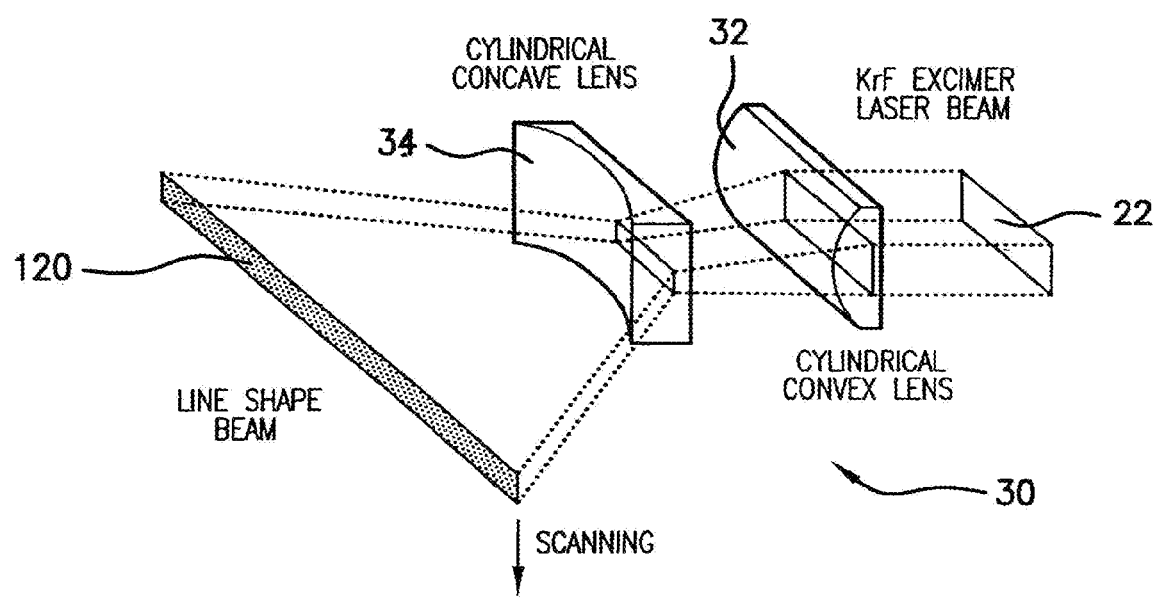
FIG. 3 shows a possible lens combination 30 for both magnifying the beam in the short axis and expanding the beam in the long axis.
Figure 4:
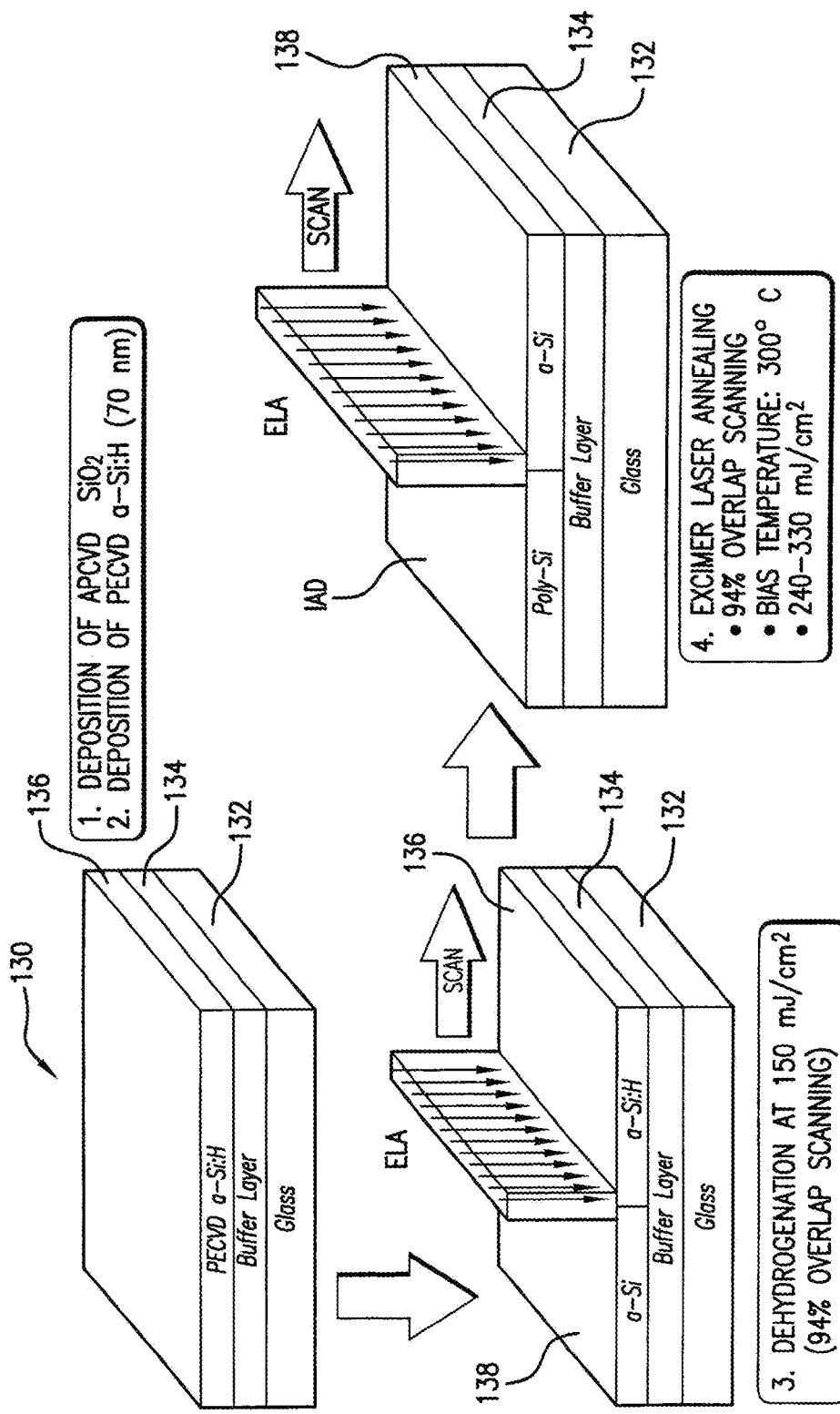
FIG. 4 shows an example of a lens assembly illustrative of the effect of beam homogenization carried out in the long axis beam homogenizer.
Figure 5:
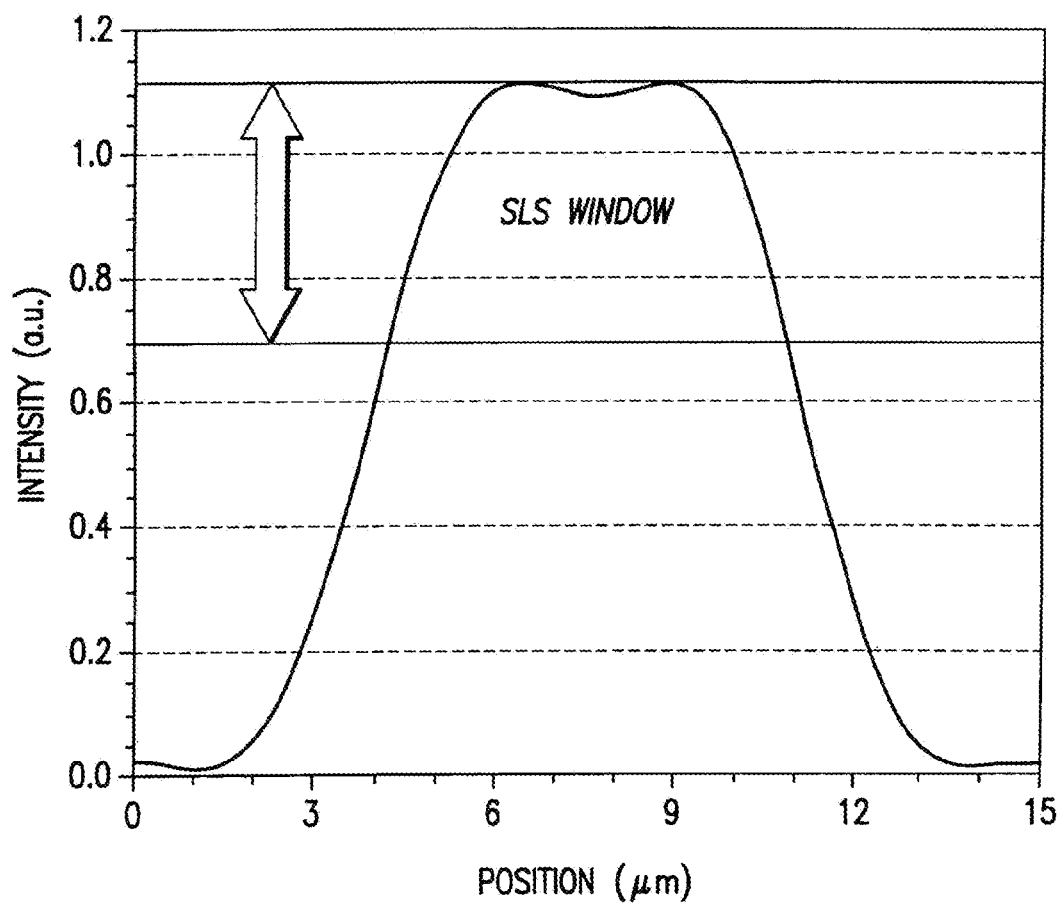
FIG. 5 shows a beam intensity profile.
Figure 10A:
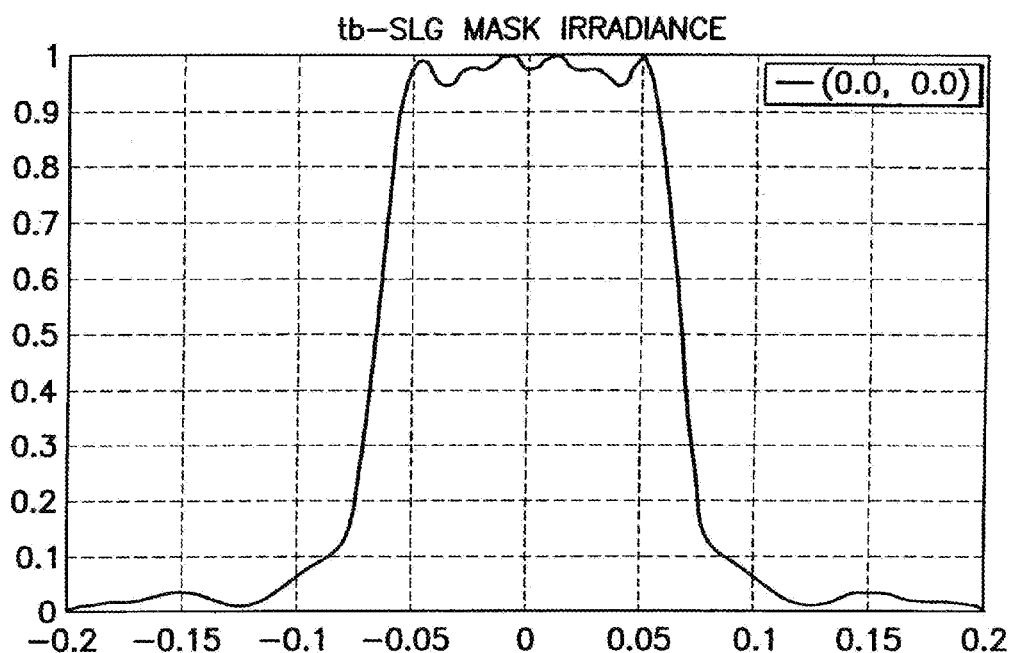
FIGS. 10A and 10B show beam intensity profiles.
Figure 10B:
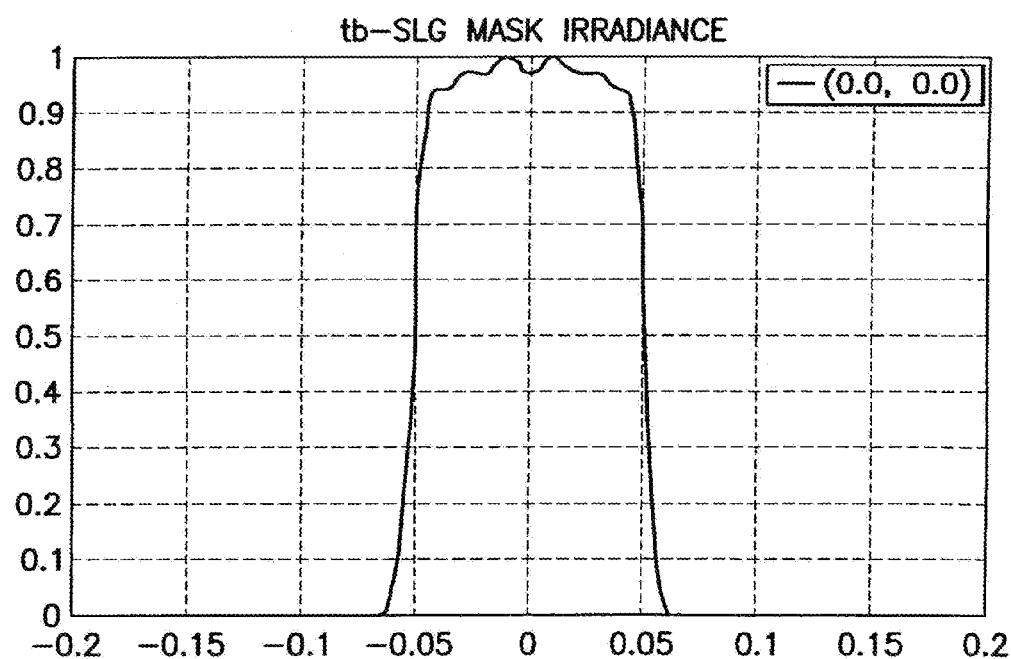
Figure 11:
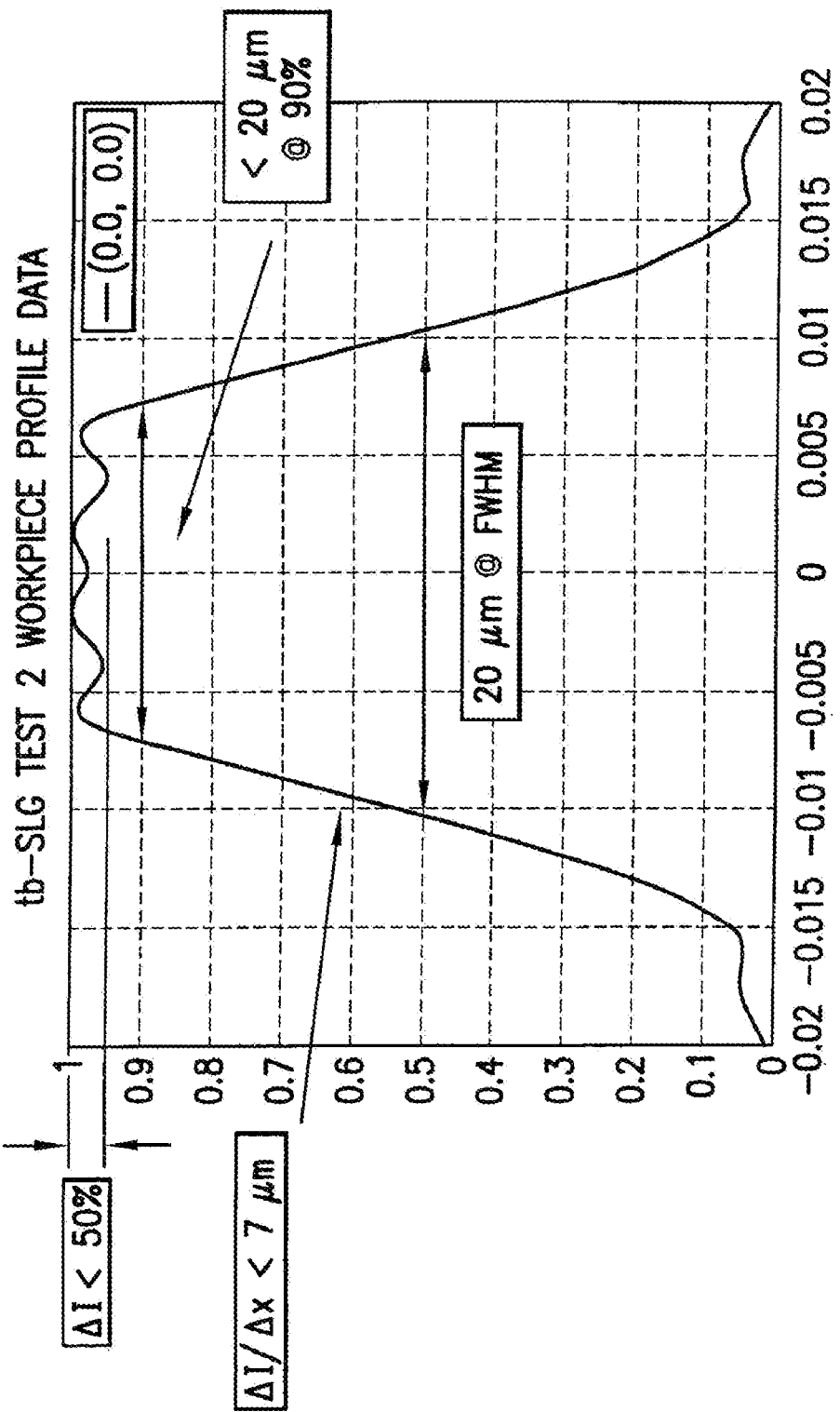
FIG. 11 shows a beam intensity profile.

FIG. 10 shows an example of an intensity profile in the short axis of a beam delivered according to aspects of an embodiment of the present invention to the mask plane, showing a side wall slope of 0.02 μm from 10% to 90% and a beam linewidth of about 130 μm FWHM. FIG. 1B shows a beam trimmed/chopped by the field stop slit (mask) to form a beam with about 100 μm FWHM and a slope of 0.01 μm from 10% to 90% exiting the mask. FIG. 11 shows an imaged pulse beam width in the short axis at the workpiece that has, e.g., a <20 μm at 90%, a slope of ΔI/Δx of <7 μm and a ΔI of <5%.

Figures 12A, 12B:
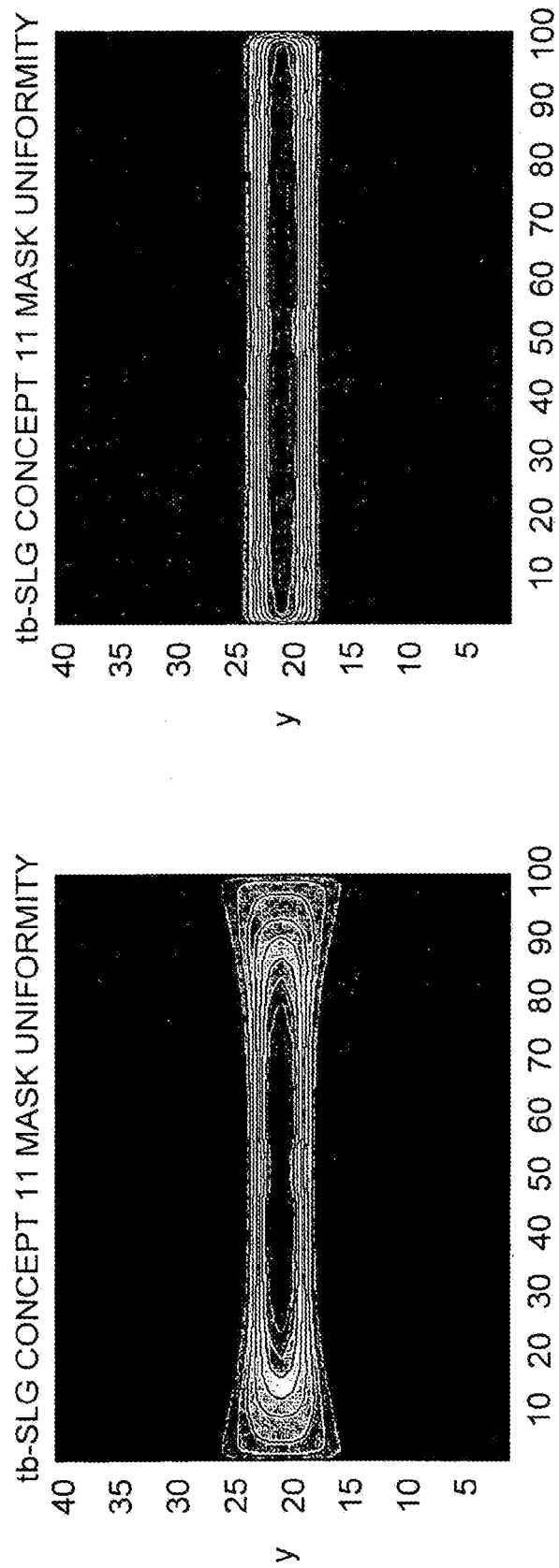
FIGS. 12A and 12B show beam intensity profiles.

FIG. 12A a shows an example of a beam with a bow tie lateral beam width divergence and FIG. 12B shows a beam with the divergence removed according to aspects of an embodiment of the present invention.

Figure 13:
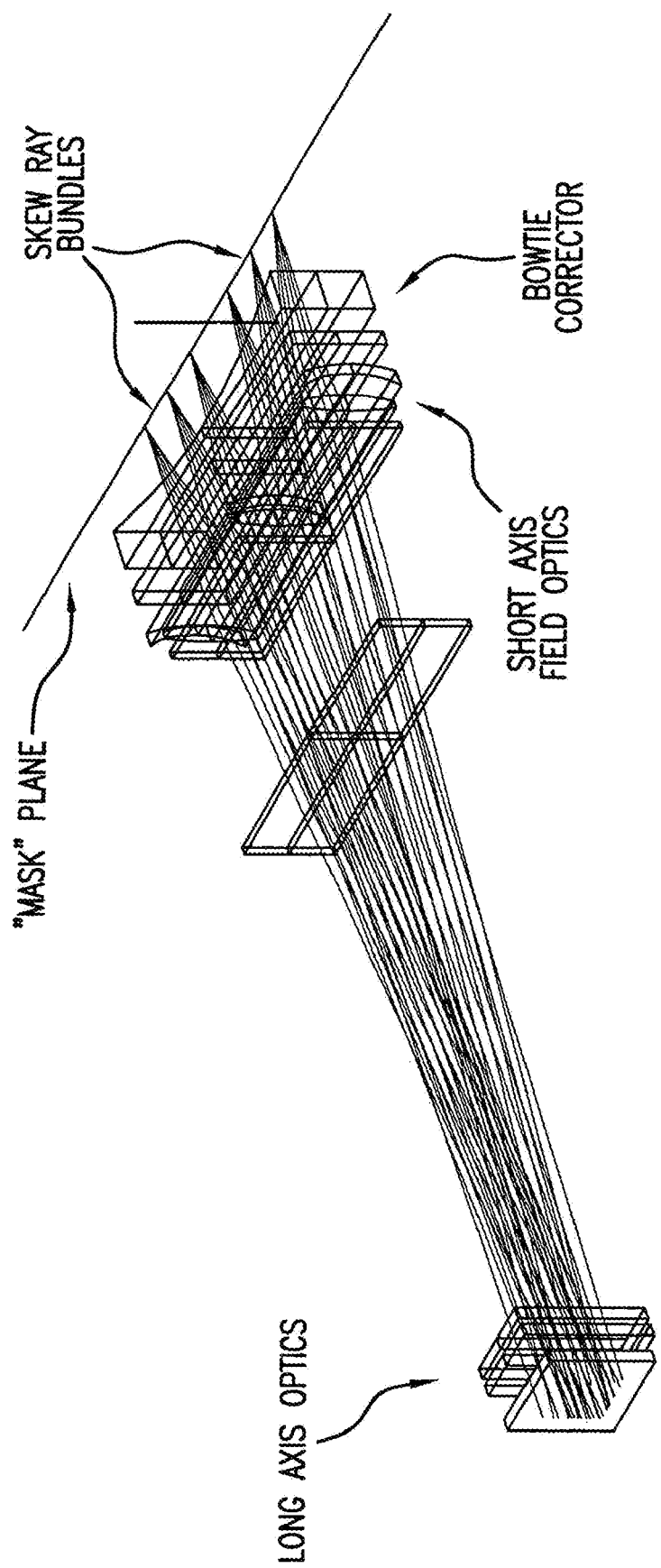
FIG. 13 shows an optical arrangement according to aspect of an embodiment of the present invention.

FIG. 13 shows an optical system according to aspects of the present invention including a bow tie divergence correcting optical element.

XeF is a suitable laser system according to aspects of the present invention since the center wavelength of around 351 nm is within the region where the reflectivity of silicon for the given wavelength remains very low, and the consequent absorption very high for that wavelength, whereas much above this wavelength the absorption rapidly drops of to levels that require energy delivery to the workpiece that are very difficult to attain. In addition, 351 nm is in a range of the DUV where optical component damage considerations may be somewhat comfortably and inexpensively met, whereas, especially at such high pulse repetition rates, dropping down to a lower nominal wavelength of, e.g., 248 for KrF, can make optical damage avoidance considerations much more difficult and expensive to meet.

Applicants have also recognized the desirability of placing the short axis optics before the long axis optics in the optical train between the laser and the workpiece.

According to aspects of eh present invention the linewidth in the short axis, $LW_{vert}=p_v \, f_s \, [(f_1+f_2)-\alpha]$, where $p_v$ is the width in the short axis of, e.g., the individual cylindrical lenses forming each channel in the homogenizer and a. is the distance between the first and second bank of such cylindrical lenses along the optical path, $f_s$ relates to the focusing optic of the short axis homogenizer. LW at the workpiece $LW_{wp}$ is equal to the reduction ratio (RED") multiplied by the $LW_{vert}$. $LWIFF+244\lambda$(f/the slit aperture)$=244\lambda(F_{short}/p_v)$. Further, $LW_{DIFF}$ of the mask is approximately equal to $RED(LW_{DIFF})$. The linewidth divergence $LW_{DIV}$ is approximately equal to $f_{s1}$ of the system times $\theta_s$ the short axis divergence of the laser beam. $f_{s1}$ for the system for each channel=$(f_1/f_2)*f_{short\,axis}*RED$, e.g., 50/45 times 100 mm times 1/5×, so that $LW_{DIV}=20$ mm×0.0001 or approximately 2 µm. The lenses $f_1$ and $f_2$ in tandem are telescoping and collimating. For some control const function, e.g., $J=RED\,LWv+LW_{DIFF}=LW_{DIV}$, J can be minimized subject, e.g., to some system constraints, e.g., $p_v$ and $f_s$. $\theta_{s1}$ divergence equals $\theta_{short\,axis}$ of the laser times ($W_L$ of the laser/Ws. This applies until either or both of laser divergence or coherence creates a problem. Without $\alpha<f_1+f_2$ cross talk can occur in the adjacent channels resulting in, e.g., stripes in the image at the workpiece. Additionally, $f_1$ and $f_2$ can be adjusted to control uniformity and sidewall slope at the field stop, and thus at the workpiece. Edge blur in the verticality of the sidewalls is a function of both geometric aberrations and laser divergence.

According to aspects of the present invention applicants have proposed to provide a very narrow elongated beam to the workpiece compared to the hundreds of µm linewidth of the art. Also according to aspects of an embodiment of the present invention applicants have proposed to nest the long axis array.

According to aspects of the present invention there is provided a high energy, high repetition rate workpiece surface heating mechanism comprising: a pulsed XeF laser operating at or above 4000 Hz and producing a laser output light pulse beam at a center wavelength of about 351 nm; an optical system narrowing the laser output light pulse beam to less than 20 µm in a short axis of the laser output light pulse beam and expanding the laser output light pulse beam to form in a long axis of the beam a workpiece covering extent of the long axis, e.g., 370 mm or 930 mm; the optical system including a field stop intermediate the laser and the workpiece; the workpiece comprising a layer to be heated; wherein the optical system focuses the laser output light pulse beam at a field stop with a magnification sufficient to maintain an intensity profile that has sufficiently steep sidewalls to allow the field stop to maintain a sufficiently steep beam profile at the workpiece without blocking the beam profile at too high an intensity level, e.g., trimming or chopping the beam profile at about the 5-10% intensity level as opposed to at or above the FWHM as in the art.

We claim:

1. A high energy, high repetition rate workpiece surface heating mechanism comprising:
   a pulsed gas discharge laser operating producing a laser output light pulse beam;
   an optical system narrowing the laser output light pulse beam to less than 20 µm in a short axis of the laser output light pulse beam and expanding the laser output light pulse beam to form in a long axis of the beam a workpiece covering extent of the long axis;
   the optical system including a field stop intermediate the laser and the workpiece;
   the workpiece comprising a layer to be heated;
   wherein the optical system focuses the laser output light pulse beam at a field stop with a magnification sufficient to maintain an intensity profile that has a sufficiently steep sidewall to allow the field stop to maintain a sufficiently steep beam profile at the workpiece without blocking the beam profile at too high an intensity level.

2. The apparatus of claim 1, further comprising:
   a high average power in the laser light output pulse beam as delivered to the workpiece.

3. The apparatus or claim 1, further comprising:
   a linebow correction mechanism in a short axis optical assembly.

4. The apparatus of claim 1, further comprising:
   the linebow correction mechanism comprises a plurality of weak cross cylinders.

5. The apparatus of claim 1, further comprising:
   the optical system comprises a catadioptic projection system.

6. The apparatus of claim 1, further comprising:
   wherein the line width due to laser diffraction and divergence is less than geometric limitations.

7. The apparatus or claim 1, further comprising:
   the system projects adjacent peaks of the nominal XeF spectrum to improve overall depth of focus through the separate center wavelengths of each respective adjacent peak having a different focal plane at the workpiece.

8. The apparatus of claim 1, further comprising;
   a linebow is correction mechanism within a field stop optical assembly correcting linebow at the field stop plane and within a workpiece projection optical assembly correcting linebow at the workpiece plane.

9. An apparatus comprising:
   a pulsed gas discharge laser adapted to produce a laser output light pulse beam;
   an optical system adapted to narrow the laser output light pulse beam to less than 20 µm in a short axis of the laser output light pulse beam and further adapted to expand the laser output light pulse beam to form in a long axis of the beam a workpiece covering extent of the long axis;
   the optical system including a field stop intermediate the laser and the workpiece;
   the workpiece comprising a layer to be heated;
   wherein the optical system focuses the laser output light pulse beam at the field stop with a magnification sufficient to maintain an intensity profile that has a sufficiently steep sidewall to allow the field stop to maintain a sufficiently steep beam profile at the workpiece, and wherein the optical system is further adapted to trim the profile at the field stop at approximately the 5-10% intensity level.

10. The apparatus of claim 9, wherein the laser light output pulse beam comprises a high average power as delivered to the workpiece.

11. The apparatus or claim 9, wherein the apparatus further comprises a linebow correction mechanism disposed within a short axis optical assembly.

12. The apparatus of claim 11, wherein the linebow correction mechanism comprises a plurality of weak cross cylinders.

13. The apparatus of claim 9, wherein the optical system further comprises a catadioptic projection system.

14. The apparatus or claim 9, wherein the apparatus is further adapted to project adjacent peaks of the nominal XeF spectrum to improve overall depth of focus through the separate center wavelengths of each respective adjacent peak having a different focal plane at the workpiece.

15. An apparatus comprising:
a pulsed gas discharge laser adapted to produce a laser output light pulse beam;
an optical system adapted to narrow the laser output light pulse beam to less than 20 μm in a short axis of the laser output light pulse beam and further adapted to expand the laser output light pulse beam to form in a long axis of the beam a workpiece covering extent of the long axis;
the optical system including a field stop intermediate the laser and the workpiece;
the workpiece comprising a layer to be heated;
wherein the optical system focuses the laser output light pulse beam at a field stop with a magnification sufficient to maintain an intensity profile that has a sufficiently steep sidewall to allow the field stop to maintain a sufficiently steep beam profile at the workpiece, but without trimming the intensity profile at or above its full width, half maximum values.

16. The apparatus of claim 15, wherein the laser light output pulse beam comprises a high average power as delivered to the workpiece.

17. The apparatus or claim 15, wherein the apparatus further comprises a linebow correction mechanism disposed within a short axis optical assembly.

18. The apparatus of claim 17, wherein the linebow correction mechanism comprises a plurality of weak cross cylinders.

19. The apparatus of claim 15, wherein the optical system further comprises a catadioptic projection system.

20. The apparatus or claim 15, wherein the apparatus is further adapted to project adjacent peaks of the nominal XeF spectrum to improve overall depth of focus through the separate center wavelengths of each respective adjacent peak having a different focal plane at the workpiece.

* * * * *